United States Patent [19]
Nelson et al.

[11] Patent Number: 5,457,298
[45] Date of Patent: Oct. 10, 1995

[54] COLDWALL HOLLOW-CATHODE PLASMA DEVICE FOR SUPPORT OF GAS DISCHARGES

[75] Inventors: Carl W. Nelson, Hayward; Richard D. Weir, Agoura Hills, both of Calif.

[73] Assignee: Tulip Memory Systems, Inc., Fremont, Calif.

[21] Appl. No.: 98,417

[22] Filed: Jul. 27, 1993

[51] Int. Cl.$^6$ .................. B23K 10/00; H01L 21/306
[52] U.S. Cl. .............. 219/121.52; 219/121.43; 219/121.4; 156/345; 204/298.37
[58] Field of Search ............. 219/121.43, 121.44, 219/121.4; 156/345, 646; 204/298.18, 298.16, 298.17, 298.37; 35/111.21, 111.81

[56] References Cited

U.S. PATENT DOCUMENTS

| | | | |
|---|---|---|---|
| 3,562,141 | 2/1971 | Morley | 204/298 |
| 4,197,175 | 4/1980 | Moll et al. | 204/192 |
| 4,254,159 | 3/1981 | Pulker et al. | 427/38 |
| 4,346,123 | 8/1982 | Kaufmann | 427/38 |
| 4,483,737 | 11/1984 | Mantei | 156/643 |
| 4,588,490 | 4/1986 | Cuomo et al. | 204/298 |
| 4,619,748 | 10/1986 | Moll et al. | 204/192.31 |
| 4,745,337 | 5/1988 | Pichot et al. | 315/111.41 |
| 4,891,560 | 1/1990 | Okumura et al. | 315/111.41 |
| 4,960,073 | 10/1990 | Suzuki et al. | 118/723 |
| 4,990,229 | 2/1991 | Campbell et al. | 204/298.06 |
| 4,996,077 | 2/1991 | Moslehi et al. | 427/38 |
| 5,038,013 | 8/1991 | Akazawa et al. | 219/121.43 |
| 5,081,398 | 1/1992 | Asmusser et al. | 315/111.41 |
| 5,091,049 | 2/1992 | Campbell et al. | 156/643 |
| 5,144,196 | 9/1992 | Gegenwarl et al. | 315/111.41 |

OTHER PUBLICATIONS

"Hollow Cathode Discharge Beams In Vacuum Processing" by John R. Morley; Trans. Vac. Met. Conf. 1963; American Vac. Soc.; pp. 186–202.

"High Rate Ion Production for Vacuum Deposition" by John R. Morley and Hugh R. Smith; reprinted from J. Vac. Sci. Technol., vol. 9, No. 6, Nov.–Dec. 1972.

Primary Examiner—Mark H. Paschall
Attorney, Agent, or Firm—Limbach & Limbach

[57] ABSTRACT

A hollow-cathode plasma device includes a hollow chamber composed of an electrically conductive material with a gas inlet at one end and a plasma outlet at an opposite end, a multipolar magnet array surrounding a portion of the chamber for isolating the plasma from the walls of the chamber, and a radiofrequency power source connected to the chamber.

15 Claims, 4 Drawing Sheets

COLDWALL HOLLOW-CATHODE PLASMA DEVICE FOR SUPPORT OF GAS DISCHARGES

BACKGROUND OF THE INVENTION

1. Field of the Invention

This invention relates generally to supported-gas-discharge sputter-deposition, sputter-etching, and substrate-bias-sputtering configurations in which plasma density is increased by the hollow-cathode effect.

2. Description of the Relevant Art

A. Glow-discharge Sputtering

Glow-discharge sputtering processes have long been used primarily in microelectronic technology for both etching and deposition: 1) etch-cleaning of substrates prior to deposition, 2) deposition of thin films, and 3) pattern etching of thin films. Such processes are used in the manufacture of silicon integrated-circuit devices, thin-film microelectronic circuits, magnetic-recording disk media, magnetic record/reproduce heads, magneto-optical disk media, etc. These processes, too, are widely used in other industries, such as those employing optical coatings, decorative coatings, and wear-resistant coatings.

Typical configurations for glow-discharge sputtering processes include a dc-powered planar disk diode; a high-radiofrequency-powered (e.g., 13.56 MHz) planar disk diode; a dc- or rf-powered planar disk triode with a thermionic hot-filament cathode; dc- or rf-powered magnetron diodes in various shapes and forms, such as a cylindrical post, a cylindrical hollow, a planar disk, a planar rectangle, a planar circular annular ring, a conical ring, and a cylindrical ring. A related configuration for evaporative ion plating combines dc- or rf-powered glow-discharge substrate bias sputtering with an evaporation source heated by a 270° magnetic-field-deflected electron beam and having a water-cooled copper hearth from which a coating material is evaporated, or with an evaporation source having instead a hot-hollow-cathode-discharge beam to evaporate the coating material from the water-cooled copper hearth. Another configuration is ion-beam sputtering particularly where broad-beam ion sources are used.

For a given source-to-substrate spacing, obtainable sputter-deposition rates range from (1) low for a dc-powered planar disk diode to (2) moderate for an rf-powered planar disk diode to (3) high for a dc- or rf-powered planar disk triode and also for various dc- or rf-powered magnetron diode forms. A significant advantage of the simple planar-disk-diode sputtering source over other configurations is that scaling to larger diameters is easy and results in increasingly better uniformity of film thickness and film morphology over the substrate area parallel to and coaxial with the source and whose diameter nearly equals that of the source, without the necessity for any substrate motion.

The main advantage of a triode sputtering source is that the plasma is formed independently between a thermionic hot-filament cathode and an anode. The separately powered planar-disk-diode cathode is inserted within and parallel to the plasma column. Since the gas discharge is fed and maintained by electrons emitted from the thermionic hot-filament cathode and not by the secondary electrons from the planar-disk-diode cold cathode, the plasma can be operated at much lower gas pressure (low millitorr region), the voltage and hence the bombarding-ion energy can be selected even down to very low energy independent of the main discharge current or of the gas pressure, and the bombarding-ion current density at a given voltage can be regulated by varying accordingly the main discharge current. The main discharge current depends on the amount of thermionically emitted electrons. Electron emission is controlled by adjusting the temperature of the filament with more electrons being emitted by increasing the heating current through the filament. Operation at low gas pressure reduces or eliminates several complications such as diffusion of sputtered atoms by gas scattering back to the sputtering target, poorly defined bombarding-ion energies and angles of incidence, and resonance charge-exchange effects in the ion-accelerating region (the dark-space region of the gas discharge). The triode does have the disadvantages of filament burnout which is exacerbated by the presence of any reactive gases, and of the lack of scalability to larger areas because of plasma inhomogeneity.

A magnetron sputtering source is defined as a diode in which a magnetic field B is used in concert with an electric field E at the cathode surface (E being perpendicular to the cathode surface and some portion of B being parallel to the cathode surface) to form electron traps which are so configured that the E×B electron drift current closes on itself. In planar disk or rectangular (and other shapes as well) magnetron versions, a plasma ring is obtained usually by means of a permanent-magnet array directly behind the cathode so configured that there is a region where the locus of magnetic field lines in front of and parallel to the cathode surface is a closed path. Bounding this region, the magnetic field lines enter the cathode surface. The resulting closed-path tunnel-shaped magnetic field causes an intensely glowing-ring region of the gas discharge to be constrained adjacent to the cathode surface. Like the triode, magnetron sputtering sources are operable in the low-millitorr-pressure region and have high obtainable sputter-deposition rates, but unlike the triode, the target voltage and ion current density are not independently controllable parameters.

Circular-magnetron sputtering sources are capable of providing uniform film thickness and morphology over small substrate areas, without the necessity for any substrate motion. The planar-rectangular-magnetron sputtering sources are easily scalable to large areas, but require continuous motion of the substrate in the direction perpendicular to the long axis of the source and in a plane parallel to the plane of the source in order to obtain film-thickness uniformity, and also require operation at higher gas pressure or with increased source-to-substrate separation or with some combination of both (thereby randomizing the angles of incidence of the arriving sputtered atoms) in order to obtain film-morphology uniformity. Consequently, the many advantages of low-pressure operation are sacrificed.

It would be most desirable to have a sputtering device that would combine the advantages of each of the above-described sputtering sources with none of their respective disadvantages. The advantages such a configuration would have are as follows:

1. High obtainable sputter-deposition rates.
2. Uniformity of film thickness and film morphology over large areas, without the necessity for substrate motion.
3. Capable of operation at gas pressures in the low millitorr region and even lower.
4. Target voltage and ion current density as independently controllable parameters.

A configuration with this combination of advantages would make any coating process more efficient either in terms of time or expense and as such would greatly improve the value of the process.

B. Hollow-Cathode Plasma Devices

A hollow cathode is a plasma device which is capable of emitting a high electron current. Because of the condition that overall electroneutrality of negative and positive charges (electrons and ions) is required, along with the emitted electrons are also emitted ions generated by electron-impact ionization of the working gas. Accordingly, a hollow cathode is an efficient gas ionization source. The construction and operation of this device are described in the following references:

H. R. Kaufman, "Technology of Electron-Bombardment Thrusters", in Advances in Electronics and Electron Physics, Vol. 36 (L. Marton, ed.), Academic Press, New York, 1974, pp. 265–373.

H. R. Kaufman, R. S. Robinson, and D. C. Trock, J. of Spacecrafts and Rockets, Vol. 20 (1983), p. 77.

1. Hollow Cathode for Evaporative Ion Plating

The earliest references to the use of the hollow-cathode effect for a supported gas discharge in a coating application are ones pertaining to evaporative ion plating. These references are as follows:

J. R. Morley, U.S. Pat. No. 3,562,141, issued Feb. 9, 1971 (filed Feb. 23, 1968).

J. R. Morley and H. R. Smith, J. Vac. Sci. Technol. 9, 1377 (1972).

In the Morley evaporative-ion-plating configuration, the hot-hollow-cathode-discharge beam serves simultaneously four functions: 1) to provide efficient ionization of an inert gas argon, 2) to thermionically and magnetically support a gas discharge by increasing the number of electrons and by extending the lifetime of the available electrons, respectively, 3) to perform the heating of an evaporant contained in an electrically grounded water-cooled copper hearth so as to evaporate at high rates, and 4) to provide some amount of ionization of the evaporant.

Morley's dc-powered hollow cathode is constructed of a tantalum metal tube, since it must operate at red-heat temperatures in order to supply a sufficient amount of electrons by thermionic emission. A low-voltage (30 to 100 V) high-current (40 to 400 A) dc power source is utilized, and the hollow cathode is biased negatively with respect to the grounded chamber. One end of the tantalum metal tube is attached to stainless steel tubing with a water-cooling jacket which in turn passes through an electrically insulating vacuum-wall feedthrough and by which the argon gas is introduced to the hollow cathode and therethrough to the chamber. The other end of the tantalum tube is either pointed directly at the evaporant contained in the water-cooled copper hearth or off to one side with magnet coils arranged to bend the emitted plasma beam toward the hearth. In both cases, a magnet coil constructed of a helical spiral of stainless steel tubing, through which cooling water flows, surrounds and extends above the water-cooled copper hearth. A low-voltage (0 to 12 V) high-current (0 to 100 A) dc power source is used for the magnet coil or coils. Some other means must be used to bring the hollow cathode (or some length of it) to operating temperature before the discharge will start.

Once the discharge is initiated, an intense argon ion bombardment of the inside wall serves to maintain the hollow cathode at red-heat electron-emission temperature. The gas discharge, thus supported, within the processing chamber can be maintained down to a pressure of 0.1 mtorr and is operationally stable up to a pressure of 0.1 torr. It is perhaps most useful over the pressure range from 0.1 mtorr to 10.0 mtorr in terms of deposition-rate efficiency. A medium-voltage (100 to 800 V) medium-current (10 to 40 A) dc power source is connected with its negative terminal to an electrically isolated substrate holder, and its positive terminal to the grounded chamber, in order to provide negative biasing of the substrates for ion bombardment of the depositing film.

The main disadvantage of this hot-hollow-cathode device is its very limited life because the device is in the line of sight of the evaporant with which it will readily react and alloy at red-heat temperature and thereby greatly weaken the material. Other disadvantages include an extended cooldown period required after operation before the system can be vented to atmosphere, and an additional means needed to initiate the discharge and bring the device to operating temperature. Furthermore, in the comparison of a low-voltage high-current hot-hollow-cathode-discharge-beam evaporation source with the very widely used high-voltage low-current 270° magnetic-field-deflected electron-beam evaporation source, the thermal efficiency, which relates directly to evaporation rate and hence deposition rate, is not as high for the former. Focusing the beam spot is much easier for the latter, and beam sweep is simply not available for the former. A great deal more control over evaporation conditions is available in the latter source.

2. Hollow Cathode with Thermionic Hot Filament for Evaporative Ion Plating

An interesting plasma device combining a thermionic hot-filament cathode with the hollow-cathode effect has been developed at Balzers for use in evaporative-ion-plating applications. The references are as follows:

E. Moll and H. Daxinger, U.S. Pat. No. 4,197,175, issued Apr. 8, 1980 (filed May 26, 1978), assigned to Balzers, Liechtenstein.

H. K. Pulker, U.S. Pat. No. 4,254,139, issued Mar. 3, 1981 (filed Dec. 20, 1978), assigned to Balzers, Liechtenstein.

E. Moll, H. K. Pulker, and W. Haag, U.S. Pat. No. 4,619,748, issued Oct. 28, 1986 (filed Feb. 28, 1986), assigned to Balzers, Liechtenstein.

On one flanged end of an austenitic stainless steel tubular housing [of about 2.0 inches (50.8 mm) diameter and 6.0 inches (152.4 mm) length] with a water-cooling jacket is mounted a flanged vacuum-wall feedthrough having two electrically insulated leads to which are attached the legs of a tungsten wire filament. Also, a 0.25 inch (6.35 mm) diameter stainless steel tubing is mounted to the flanged end by which argon gas is introduced to the housing and thence to the main chamber. Between the other flanged end of the tubular housing and the flanged main-chamber opening is a flanged aperture plate (also having a water-cooling jacket) with a flanged electrical insulator ring on each side. The argon gas inlet line and the water-cooling lines are all electrically insulated from ground. In this way, the tungsten wire filament, the tubular housing, and the aperture plate are all electrically insulated from one another as well as from the grounded main chamber. On the atmospheric air side surrounding the water-cooled tubular housing is a solenoidal magnet coil.

A 50 or 60 Hz ac power source provides a heating current through the tungsten-wire-filament cathode, with more thermionic electrons being emitted by increasing the filament temperature ordinarily over the white-heat range. The ac centertap voltage of this cathode is connected to the negative terminal of a low-voltage (30 to 100 V) high-current (40 to 400 A) dc power source, so that the cathode is biased negatively with respect to the grounded main chamber. By means of a voltage-divider (resistance) network, the supply dc voltage can be accordingly partitioned so that the positive terminal of the dc power source is connected to an anode which is biased positively with respect to the grounded main chamber. In one version of an evaporative-ion-plating system designed at Balzers, this anode is an electrically isolated water-cooled copper hearth containing the evaporant and located directly below the plasma device from which the emitted intense discharge beam serves to heat and evaporate the coating material as well as to both efficiently ionize the inert gas argon and support the gas discharge. Alternatively, this water-cooled copper hearth containing the evaporant is electrically grounded to the main chamber and the positive terminal of the dc power source is also connected to the main chamber. A medium-voltage (100 to 800 V) medium-current (10 to 40 A) dc power source is connected with its negative terminal to an electrically isolated substrate holder, and its positive terminal to the grounded main chamber, in order to provide negative biasing of the substrates for ion bombardment of the depositing film.

In another version of an evaporative-ion-plating system developed at Balzers, one or more electrically isolated high-voltage low-current 270° magnetic-field-deflected electron-beam evaporation sources (also having water-cooled copper hearths) serve as the anode with a hollow-cathode plasma device located well off to one side and serving here primarily to both efficiently ionize the inert gas argon and support the gas discharge. In addition, this version offers over the above configuration and Morley's earlier design the significant advantage of decoupling the evaporation method from the plasma device so that such process parameters as evaporation rate and plasma density can be selected independently unlike the above where they are coupled. Here the electrically isolated substrate holder is not driven, but reaches a negative floating potential (with respect to ground) where the bombarding-ion current plus any secondary-electron-emission current equals the incoming electron current so that there is no net current. The bombarding-ion energy essentially equals the difference between the anode potential (strictly, the plasma potential) and the floating potential. This arrangement is used for electrically insulating substrates (glasses and ceramics) which cannot be biased anyway by a dc power source.

Alternatively, for the case of electrically conductive substrates and films, each water-cooled copper hearth of one or more high-voltage low-current 270° magnetic-field-deflected electron-beam evaporation sources is electrically grounded to the main chamber. Similarly, the hollow-cathode plasma device with a thermionic hot filament is located well off to one side and serves to both efficiently ionize the inert gas argon and support the gas discharge. The electrically isolated substrate holder is driven by a medium-voltage (100 to 800 V) medium-current (10 to 40 A) dc power source, and is biased negatively with respect to the grounded main chamber, in order to provide ion bombardment of the depositing film.

A 0.197 inch (5.0 mm) diameter orifice is used in an aperture plate of the hollow-cathode plasma device so that an argon gas pressure of 37.5 mtorr (5.0 Pa) can be maintained within the plasma device while the pressure in the adequately pumped main chamber can range from 0.15 to 15.0 mtorr (0.02 to 2.0 Pa). This separately electrically insulated aperture plate also serves temporarily as an anode to provide initiation of the gas discharge whereby connection is made briefly to the positive terminal of the low-voltage (30 to 100 V) high-current (40 to 400 A) dc power source with 100 V applied between the thermionic hot-filament cathode and this temporary anode plate. After the discharge is initiated, an intense plasma beam is emitted through the orifice into the main chamber, and both the tubular housing of the hollow cathode and the aperture plate reach a negative floating potential (with respect to ground) where the incoming ion current (plus any secondary-electron-emission current) and incoming electron current are equal so that there is no net current.

The main advantage of this plasma device over a hot-hollow-cathode tantalum tube is that the hot tungsten wire filament is contained in a water-cooled tubular housing and is shielded from the evaporant both by the higher gas pressure within the housing and by the aperture plate. In both cases, the plasma device operates by means of the hollow-cathode effect where the electrons which are accelerated across the dark-space region and enter the glow-space region cannot easily escape, since they encounter a sheath with repulsive forces whenever they approach a negatively biased wall. The only losses are out the aperture end. In both cases, a very high plasma density results because superimposed on the hollow-cathode effect is a gas discharge contained within that is simultaneously thermionically and magnetically supported by increasing the number of electrons and by extending the lifetime of the available electrons, respectively. In the hot-tantalum-tube case, the thermionic electrons are emitted at lower density from a comparatively large area at red-heat temperature, whereas in the hot-tungsten-wire case, the thermionic electrons are emitted at higher density from a comparatively small area at white-heat temperature, so that the total number of thermionically emitted electrons is essentially the same for both cases. In both cases, the plasma beam emitted through the aperture into the main chamber serves further to support the gas discharge generated by the power source which provides negative biasing (with respect to ground) of the substrate holder, if used. By this means, the plasma density of the gas discharge in the main chamber can be substantially increased to the extent that the discharge can be maintained down to a pressure of 0.1 mtorr (0.0133 Pa).

The main disadvantage of these plasma devices is that should a reactive gas or gases be flowed through them, the life of their respective hot elements is considerably diminished, and since the reaction products are usually volatile, they would contaminate the film deposition.

3. Hollow Cathode with Thermionic Tantalum Foil

Another hollow-cathode plasma device, disclosed by Kaufman in the references cited above, consists of a small-diameter tantalum tube with 0.25 inch (6.35 mm) outside diameter and which is constricted at its exit tip to an aperture of 0.0394 inch (1.0 mm) diameter. Inside this tube and near the aperture is an insert consisting of a few layers of thin tantalum foil. The inert gas argon is introduced through the other end of this tube at a mass flowrate of 0.157 torr L/s (12.4 sccm) so as to maintain a pressure of 1.0 torr (133 Pa) within this tube. Outside of the aperture end is a keeper electrode or anode, which is used to initiate and maintain a discharge from the hollow cathode. A low-voltage (30 to 100 V) high-current (10 to 100 A) dc power source is utilized, and the hollow cathode is biased negatively and the keeper anode biased positively with respect to the grounded chamber. Since the pressure inside the hollow cathode is much higher than outside, the plasma density of the gas discharge inside is much higher than that outside. Thus the intense argon ion bombardment of the thin-tantalum-foil insert, which is in poor thermal contact with the tantalum tube, serves to bring this insert to thermionic-electron-emission temperature. The innermost layer of foil reaches white-heat temperatures where the increasing number of thermionically emitted electrons causes a further increase in plasma density.

Once this increase in plasma density occurs, the relative potential of the keeper anode with respect to the hollow cathode can be reduced to voltages in the 30 to 50 V range. If more emission is required, an increase in voltage results in an increase in energy of the argon ions bombarding the insert, and the temperature of the insert is increased.

As is the case with the above-described plasma devices, a reactive gas cannot flow through this hollow cathode without greatly diminishing its life. This device, too, requires an extended cooldown period after operation before the system can be vented to atmosphere. It does have an advantage over the others because its operating pressure is appreciably higher, at 1.0 torr (133 Pa), which lies in the viscous-laminar-flow pressure region, so that backdiffusion of gas from the surrounding chamber is prevented. Thus a reactive gas introduced elsewhere for the purpose of carrying out a reactive process can be employed without any deleterious effect on the device.

Broad-beam ion sources having grids for the electrostatic acceleration of ions were first developed in the program for electric space propulsion. The hot-tantalum-foil hollow-cathode plasma device was also developed in this program. In earthbound applications of gridded broad-beam ion sources, this hollow-cathode plasma device has found use as an alternative to the conventional thermionic hot-filament cathode within the discharge chamber and to the usual thermionic hot-filament neutralizer within the extracted ion beam.

4. Hollow Cathode with Magnetron Diode

A combination in which the hot-tantalum-foil hollow-cathode plasma device is coupled to a planar disk (or rectangular) magnetron diode sputtering source, making in effect a triode configuration, is disclosed in the following reference:

J. J. Cuomo, H. R. Kaufman, and S. M. Rossnagel, U.S. Pat. No. 4,588,490, issued May 13, 1986 (filed May 22, 1985), assigned to IBM Corp.

Remarkable results are obtained with this combination as conditions 1, 3, and 4 (though not condition 2) listed above of an ideal sputtering-source configuration are fulfilled. The hollow-cathode plasma device provides additional ionization of the working gas argon during the normal voltage operating range and the usual pressure operating range of the magnetron source. Since the plasma density can be enhanced by a factor of ten, the sputter-deposition rate can thereby be increased by ten times. Since, too, the gas discharge is fed and maintained by the hollow-cathode plasma device, the secondary electrons emitted from the ion bombardment of the sputtering target of the magnetron source are not required to self-sustain the discharge, and thus the configuration will operate at lower voltages and pressure than otherwise. This feature permits the pressure operating range to extend a factor of ten lower, down to 0.225 mtorr (0.03 Pa). Whereas the usual unassisted magnetron diode sputtering sources have a minimum turn-on voltage of −300 V or greater, with respect to the grounded chamber, and this voltage also increases with decreasing pressure, the hollow-cathode-assisted source will operate at voltages down to the floating potential in the range of −15 to −20 V (i.e., with zero applied voltage) with respect to the grounded chamber, where the hollow-cathode plasma device is operated at −30 to −40 V with respect to the grounded chamber. The coupling between the plasmas of the hollow cathode and the magnetron diode depends critically on positioning. An efficient and convenient coupling is obtained by positioning the aperture end of the hollow-cathode device to intersect, at the outer perimeter of the magnetron plasma ring, the magnetic field lines that traverse the front of the sputtering target to the center pole, and to be at least three Larmor radii away from that target surface.

Another use of the hollow-cathode plasma device disclosed in U.S. Pat. No. 4,588,490 consists of a single small-diameter tantalum tube of 0.25 inch (6.35 mm) outside diameter with several equispaced apertures of 0.0394 inch (1.0 mm) or less diameter along its length for use with large-area sputtering sources (or with large-area broad-beam ion sources) in order to uniformly distribute the plasma emission from this device. A thin-tantalum-foil insert is placed at each aperture to provide the necessary thermionic electron emission. For the case of a large-area planar rectangular magnetron diode sputtering source, the tantalum tube would be formed to follow the outer perimeter of the elongated plasma ring and would have its equispaced holes on the inner facing side. Thus the use of a single multi-aperture hollow-cathode plasma device with a single power source and a single working-gas (argon) supply is intrinsically simple compared to the use of several devices which must be separately powered and tediously balanced.

The common disadvantage of all hollow-cathode plasma devices that depend on thermionic electron emission for operation is the greatly diminished life obtained when a reactive gas (or gases) is flowed through any of them.

SUMMARY OF THE INVENTION

In accordance with the illustrated preferred embodiment, the present invention provides a coldwall hollow-cathode plasma device that does not depend on thermionic electron emission for operation and that can be used to directly ionize both inert and reactive gases. The hollow-cathode plasma device includes a hollow chamber composed of an electrically conductive material with a gas inlet at one end and a plasma outlet at an opposite end, a multipolar magnet array surrounding at least a portion of the chamber for confining a plasma to an area isolated from the walls of the chamber, and a radiofrequency power source connected to the chamber.

Just as in the case of the above-described conventional devices, the present invention can be used to enhance the ionization of the working gas and thereby increase the plasma density for any glow-discharge sputtering, evaporative-ion-plating, or reactive-plasma-deposition process. Reactive plasma deposition is also known as plasma-enhanced or plasma-assisted chemical vapor deposition.

The present invention has several advantages over prior plasma generation devices. The present invention has an advantage over hot hollow-cathode plasma devices in applications where the extremely elevated temperatures associated with hot hollow-cathode plasma devices for operation would be detrimental. The present invention, which can operate at or near room temperature, increases deposition and etching rates in sputtering and reactive sputtering processes. The present invention provides enhanced control of the morphology of deposited films and hence control of the physical properties and mechanical characteristics thereof, including sputter-deposited films, evaporative-ion-plated films, and reactive-plasma-deposited films.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected

DETAILED DESCRIPTION OF THE PREFERRED EMBODIMENT

FIGS. 1 through 6 of the drawings depict various preferred embodiments of the present invention for purposes of illustration only. One skilled in the art will readily recognize from the following discussion that alternative embodiments of the structures and methods illustrated herein may be employed without departing from the principles of the invention described herein. While the invention will be described in conjunction with the preferred embodiments, it will be understood that they are not intended to limit the invention to those embodiments. On the contrary, the invention is intended to cover alternatives, modifications, and equivalents, which may be included within the spirit and scope of the invention as defined by the claims.

Figure 1:
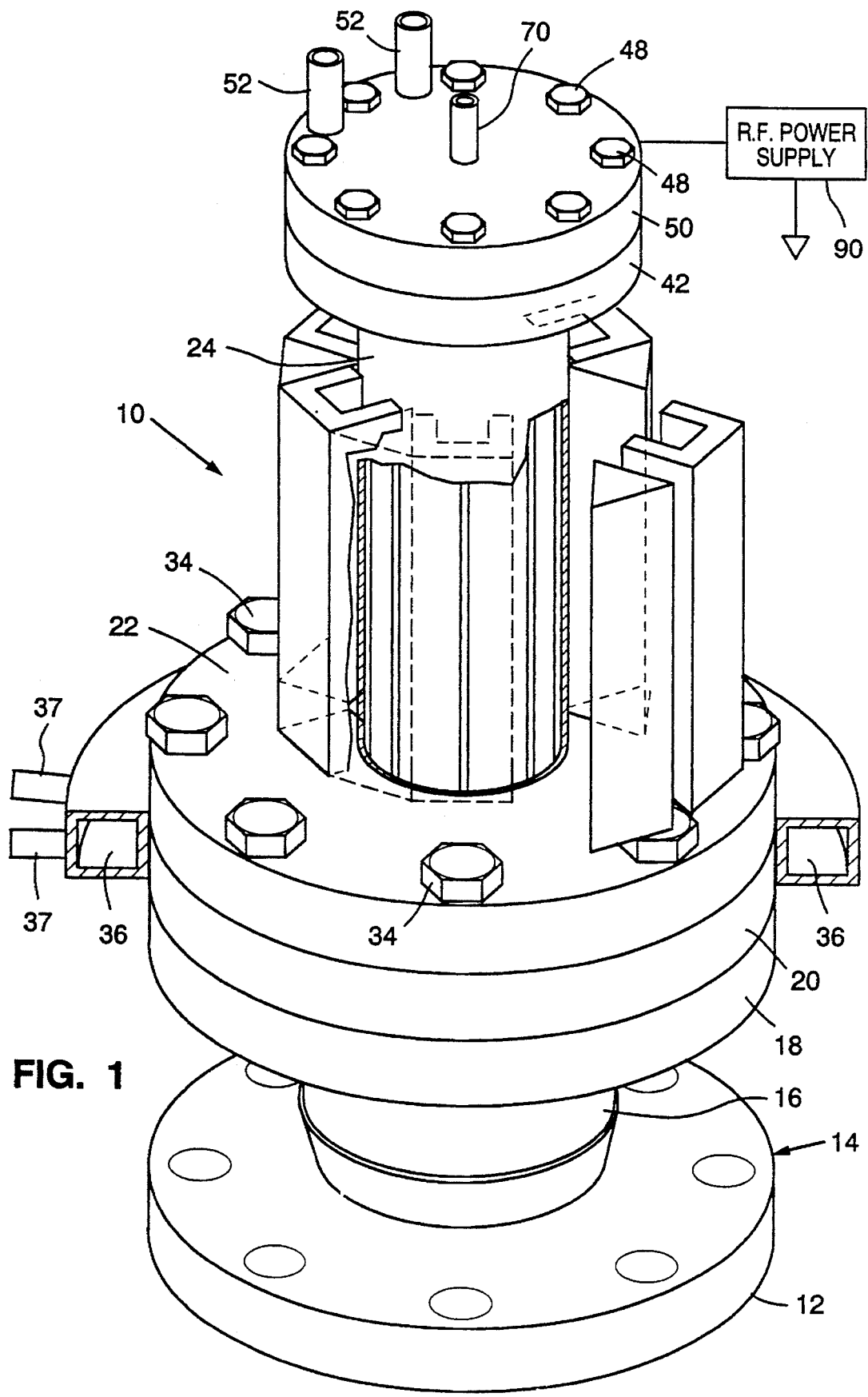
FIG. 1 is a perspective view, partially cut away, of a coldwall hollow-cathode plasma device according to the present invention.
Figure 2:
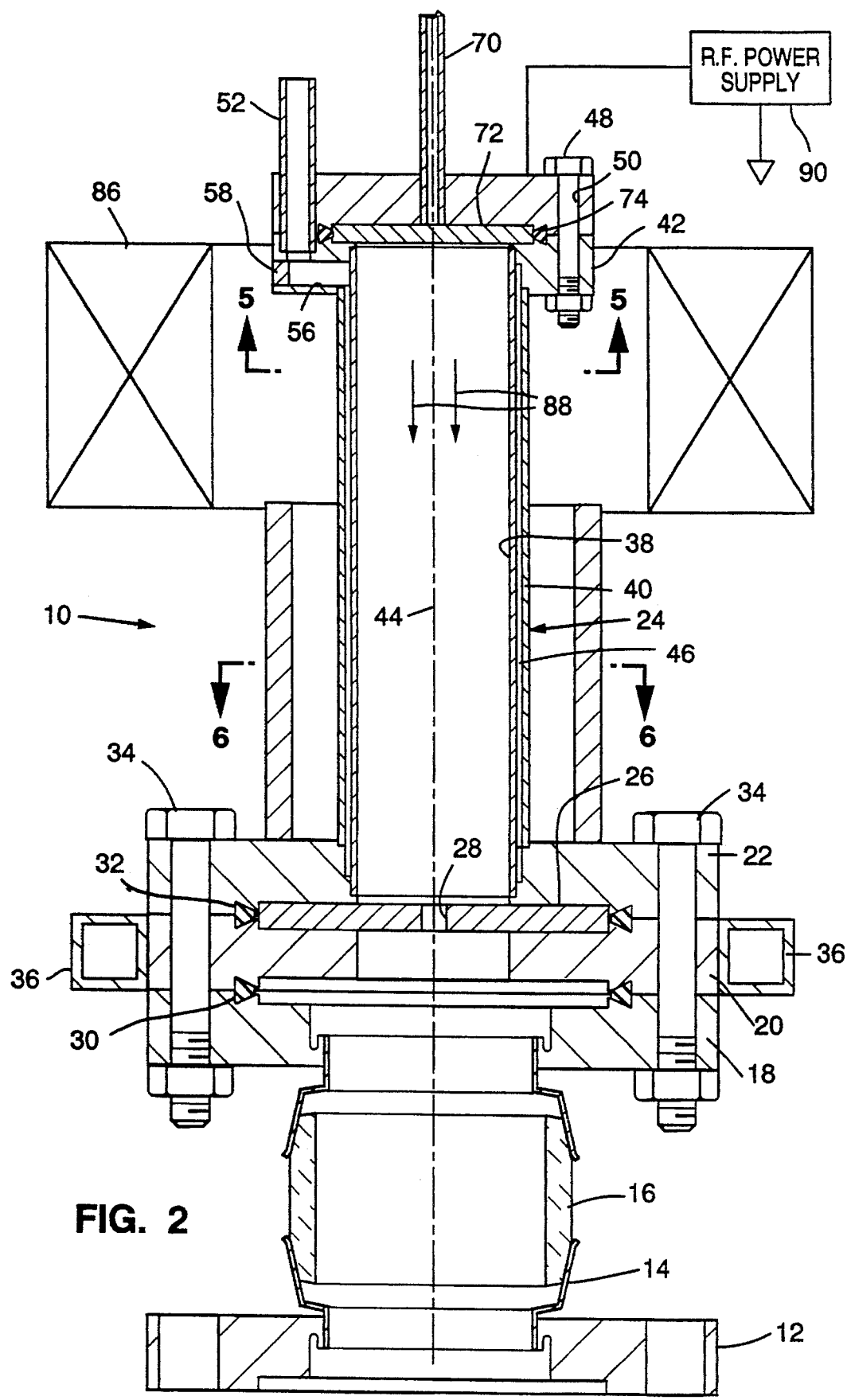
FIG. 2 is a side elevation sectional view through a longitudinal axis of the coldwall hollow-cathode plasma device of the present invention.

The preferred embodiment of the present invention is a coldwall hollow-cathode plasma device 10, as shown in FIGS. 1 and 2. The plasma device 10 is intended to be mounted onto a process chamber (not shown) in which glow-discharge sputtering, evaporative ion plating, reactive plasma deposition, or other processes take place whereby a plasma generated by the plasma device 10 and supplied to the process chamber is utilized. The plasma device 10 is mounted to the process chamber by a lower flange 12 of an electrical isolator 14. The electrical isolator 14 includes an electrical insulator 16 that electrically isolates the plasma device 10 from the process chamber. An upper flange 18 of the electrical isolator 14 mounts to a water-cooled, double-sided flange 20, which in turn mounts to a lower flange 22 of a cylindrical chamber 24. Positioned between flanges 20 and 22 is an aperture plate 26 (FIG. 2) composed of molybdenum or other high-temperature metal and having an aperture 28 through the center thereof. Seals 30 and 32 (FIG. 2) are installed between flanges 18, 20, and 22 and the flanges are bolted together with bolts 34. A tubular jacket 36 surrounds flange 20 and is connected to a source of water for cooling the flange and aperture plate 26. Water connections 37 supply water to the tubular jacket 36.

A plasma generated within the cylindrical chamber 24 flows through the aperture plate 26 and interior of the isolator 14 and into the process chamber. The cylindrical chamber 24 includes an inner tube 38 and an outer tube 40 both preferably composed of an austenitic (nonmagnetic) stainless steel with austenitic stainless steel flanges 22 and 42 welded to each end. The inner tube 38 and outer tube 40 are coaxial to a longitudinal axis 44 of the cylindrical chamber 24. There is a circumferential space 46 between the two tubes 38 and 40 in which flows a fluid that cools the chamber 24. This chamber cooling means will be described in further detail below.

Figure 4:
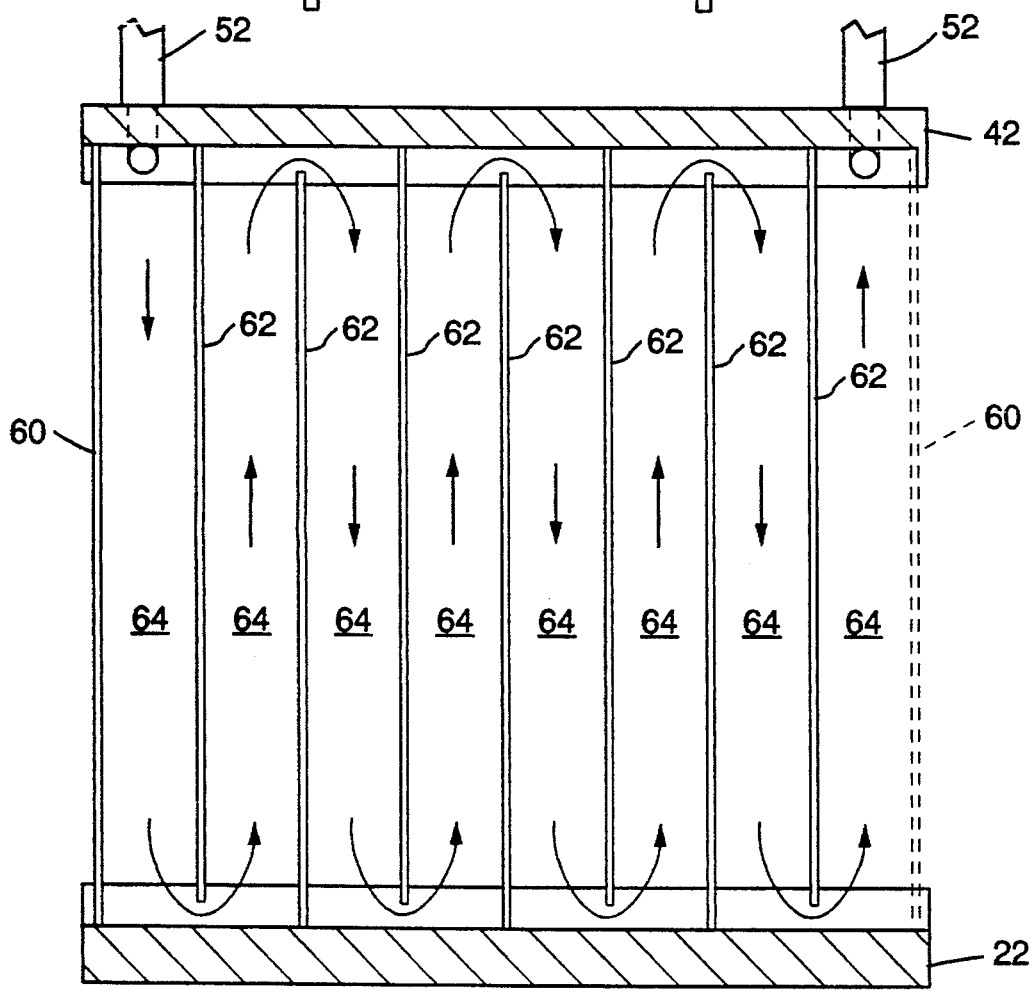
FIG. 4 is a development view of a cylindrical water-cooling jacket of the coldwall hollow-cathode plasma device of the present invention.
Figure 5:
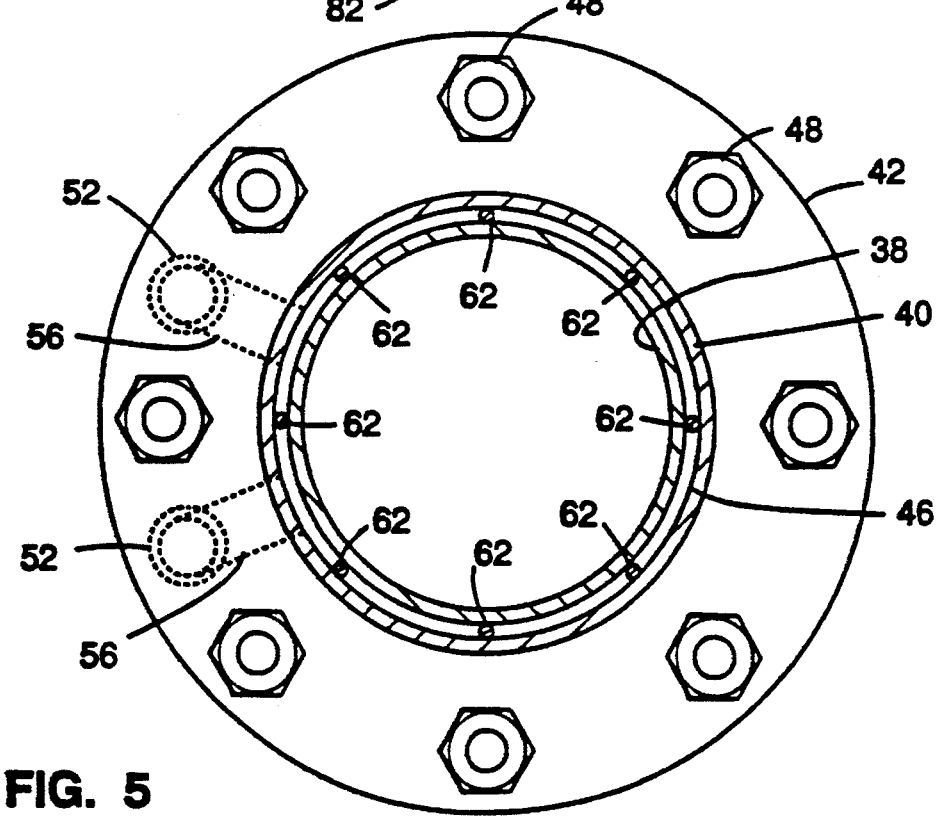
FIG. 5 is a sectional plan view of the coldwall hollow-cathode plasma device of the present invention as taken along section line 5—5 of FIG. 2, and illustrates water-cooling connections in an upper flange of the device.

The top flange 42 of the chamber 24 is bolted with bolts 48 to another flange 50 that serves as a connection point for cooling water, working gas, and radiofrequency electrical power. As to cooling the chamber 24, referring now to FIGS. 3, 4, and 5, two pipes 52 are welded to the upper flange 42 of the cylindrical chamber 24 and provide a fluid flow path into the circumferential space 46 between the two tubes 38 and 40 of the chamber. Flange 50 has two clearance holes 54 (FIG. 3) to allow the flange 50 to fit over the pipes 52. Within the top flange 42 of the chamber 24, there are two radial holes 56 (FIG. 3) drilled into the flange to the circumferential space 46. The radially outer portion of the radial holes 56 are sealed by plugs 58 (FIG. 3) welded to the flange 42. Thus, each of the pipes 52 is in fluid communication with the circumferential space 46. As shown in FIG. 4, which is an unfolded development view of the circumferential space 46, eight rods 60 and 62 divide the circumferential space into eight vertically extending cavities 64. As best shown in FIG. 5, the rods 60 and 62 have a diameter substantially equal to the circumferential gap between the tubes 38 and 40. One rod 60, positioned between the two pipes 52, extends the entire vertical length of the circumferential space 46, whereas the other rods 62 extend just short of a flange, thereby providing a passageway between adjacent cavities 64. Water enters at one pipe 52, flows through the eight cavities 64 and cools the inner tube 38 by convection and conduction, and then exits at the other pipe 52.

Figure 3:
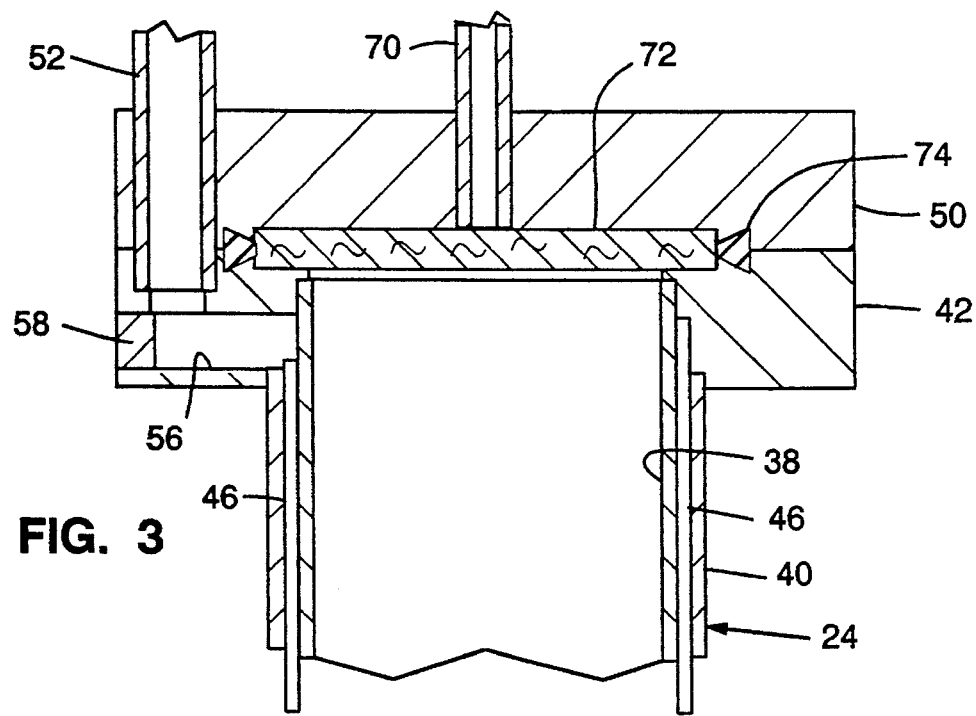
FIG. 3 is an enlarged detail side elevation sectional view of an upper flange of the coldwall hollow-cathode plasma device of the present invention.

A working gas, such as argon, is introduced into the top of the chamber 24 through a gas inlet tube 70, composed of an austenitic stainless steel, that is welded to flange 50, as shown in FIGS. 2 and 3. The gas inlet tube 70 extends through a hole in the flange 50 to a gas diffuser plate 72 that is confined between flanges 42 and 50. The gas diffuser plate 72 is preferably composed of a sintered porous metal sheet, made from an austenitic stainless steel powder or higher-nickel-content iron-nickel-chromium alloys. A seal 74 seals between the flanges 42 and 50 so that gas flowing through the tube 70 passes through the gas diffuser plate 72 to enter the chamber 24. The gas diffuser plate 72 distributes the gas from the gas inlet tube 70, and also prevents the plasma discharge from traveling up the gas inlet tube. Alternatively, a perforated metal disk can be used in place of the sintered porous metal for the gas diffuser plate 72. The pores or holes in the gas diffuser plate 72 must be smaller than the Debye length so that electrical shielding provided by the diffuser plate appears as a continuous surface to the plasma. The pores or holes in the gas diffuser plate 72 have a sufficiently small porosity so that the upstream pressure is substantially higher (e.g., several torr) than the pressure within the chamber 24 to prevent formation of a gas discharge in the gas inlet tube.

Figure 6:
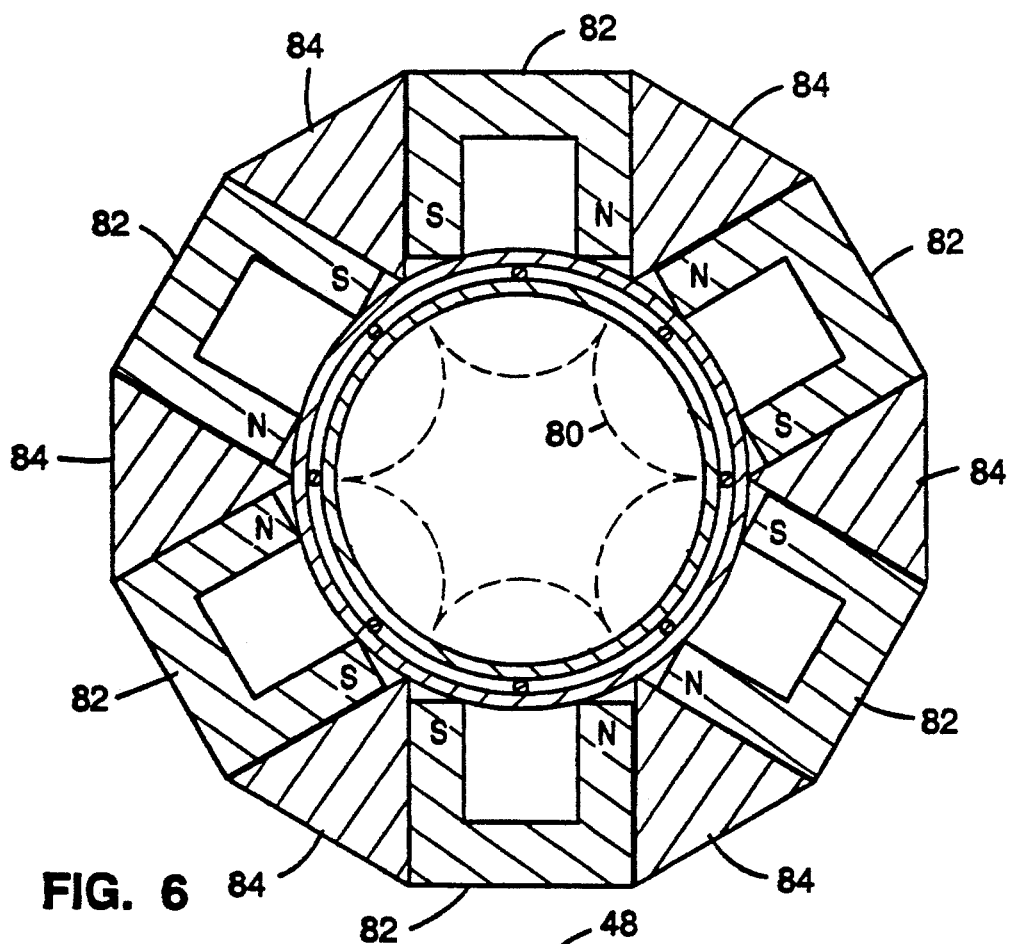
FIG. 6 is a sectional plan view of the coldwall hollow-cathode plasma device of the present invention as taken along section line 6—6 of FIG. 2, and illustrates magnet placement and magnetic-field containment within the device.

Referring now to FIGS. 1, 2, and 6, the plasma generated within the cylindrical chamber 24 is confined by two magnetic fields that exist within the chamber. A multipolar magnetic field 80 (FIG. 6) is generated by six equispaced channel horseshoe permanent magnets 82 that surround the chamber 24. The channel horseshoe magnets 82 are arranged so that adjacent poles are of like polarity. The intervening spaces between adjacent magnets are filled by spacers 84, which are equilateral triangular rods made of high-permeability low-carbon steel or other ferromagnetic material. A commercially available convenient size for the channel horseshoe magnet, preferably made of Alnico 5 alloy, is a length of 3.250 inch (82.55 mm), width of 0.984 inch (25.00 mm), height of 0.797 inch (20.24 mm), gap width of 0.500 inch (12.70 mm), and gap depth of 0.524 inch (13.31 mm).

A second magnetic field is generated by a solenoidal magnet coil 86 that surrounds an upper portion of the chamber 24, as shown in FIG. 2. Solenoidal magnet coil 86 creates an axially oriented magnetic field 88 within the chamber 24. Magnetic field 88 along with magnetic field 80 generated by the horseshoe magnets confine the electrons and ions of the plasma to the lower portion of the chamber 24, from where the plasma exits through the aperture 28 and through the electrical isolator 14 and into the process chamber below.

The cylindrical chamber 24, the water-cooling lines 37 and 52, and the gas inlet tube 70 are all electrically insulated from ground so that high-radiofrequency (13.56 MHz) power from a radiofrequency impedance-matching network and generator 90 can be applied to the plasma device 10. The main advantage of a high-radiofrequency diode discharge over a dc diode discharge is that secondary electron emission from the ion bombardment of a cold cathode is not needed to self-sustain the discharge because additional electrons are generated as a consequence of the fact that electrons oscillating in an rf field can acquire sufficient energy from the field to cause ionization in the body of the gas. The electron gains energy from the field if it undergoes collisions with gas atoms or molecules while it is oscillating so that its ordered simple harmonic motion is changed to a random motion. Such is the case provided the electron being accelerated by the rf electric field makes a collision with a gas atom or molecule before the field changes direction and decelerates the electron. Thus, the electron can increase the random component of its velocity with each elastic collision until it builds up sufficient energy to make an inelastic ionizing collision with a gas atom or molecule. The same principle applies to lower energy processes, such as gas atom or molecule excitation and gas molecule dissociation, which, too, are concurrent processes in gas discharges.

As a result of geometry of the forces imposed by the magnet configuration, the plasma is thereby confined in a magnetic bottle. The charged species (electrons and with them the ions) are reflected back into the plasma by the magnetic mirror, thereby extending their lifetime. The electrons whose lifetimes have been extended can gain energy from the high-radiofrequency field as explained above and cause further gas ionization. Another feature of the magnet configuration is the zero magnetic field which results at the very center axis of the tubular housing. Along this axis the electrons and along with them the ions have the easiest escape path out of the tube into the main chamber as they are carried out by the gas flow in that direction.

From the above description, it will be apparent that the invention disclosed herein provides a novel and advantageous coldwall hollow-cathode plasma device. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A hollow-cathode plasma device comprising:

an evacuated hollow chamber including an outlet for a plasma formed within the chamber, wherein the chamber is composed of an electrically conductive material and has one or more walls;

means for introducing working gas into the chamber;

a multipolar magnet array surrounding at least a portion of the chamber for confining the plasma to an area isolated from the walls of the chamber; and means for applying radiofrequency power directly to the chamber.

2. A hollow-cathode plasma device as recited in claim 1 wherein the chamber is cylindrical in shape and has a longitudinal axis and wherein the magnet array is coaxial to the longitudinal axis of the chamber and surrounds the circumference of the cylindrical chamber along at least a portion of the longitudinal axis of the cylindrical chamber.

3. A hollow-cathode plasma device as recited in claim 2 wherein the multipolar magnet array includes a plurality of channel horseshoe magnets aligned with the longitudinal axis of the cylindrical chamber with the legs of the horseshoe magnets extending toward the axis of the chamber.

4. A hollow-cathode plasma device as recited in claim 3 wherein the channel horseshoe magnets are arranged with like poles adjacent to each other, and wherein the plasma device further comprises spacers of ferromagnetic material disposed proximate the adjacent poles of like polarity of adjacent magnets.

5. A hollow-cathode plasma device as recited in claim 1 wherein the means for introducing a working gas into the chamber includes a gas diffuser positioned at an end of the chamber opposite the outlet.

6. A hollow-cathode plasma device as recited in claim 5 wherein the gas diffuser is composed of a sintered porous metal sheet.

7. A hollow-cathode plasma device as recited in claim 1 further comprising an aperture plate having an aperture therein providing the outlet from the chamber.

8. A hollow-cathode plasma device as recited in claim 7 further comprising means for cooling the aperture plate by heat transfer to a circulating fluid.

9. A hollow-cathode plasma device as recited in claim 1 wherein the means for applying radiofrequency power to the chamber includes a power supply comprised of an impedance-matching network and generator having one terminal connected to the chamber and the other terminal connected to ground, and further includes insulation means for electrically isolating the chamber.

10. A hollow-cathode plasma device as recited in claim 1 further comprising means for cooling the chamber by heat transfer to a circulating fluid.

11. A hollow-cathode plasma device as recited in claim 10 wherein the chamber is cylindrical in shape and wherein the means for cooling the chamber includes an outer tube surrounding the cylindrical chamber with a clearance space between the chamber and the outer tube and means for pumping a cooling fluid through the clearance space.

12. A hollow-cathode plasma device as recited in claim 1 further comprising means for generating a second magnetic field within the chamber for confining the plasma within the chamber to an area proximate the outlet from the chamber.

13. A hollow-cathode plasma device as recited in claim 12 wherein the chamber is cylindrical in shape and wherein the means for generating a second magnetic field is a solenoidal magnet coil positioned coaxially to a longitudinal axis of the chamber and generating a magnetic field within the chamber.

14. A hollow-cathode plasma device comprising:

a hollow cylindrical chamber having a longitudinal axis and composed of an electrically conductive material;

an aperture plate having an aperture therein providing an outlet from the chamber for a plasma formed within the chamber;

a gas diffuser positioned at an end of the chamber opposite the aperture plate for introducing a working gas into the chamber;

means for cooling the chamber by heat transfer to a circulating fluid;

a multipolar magnet array coaxial to the longitudinal axis of the chamber and surrounding the circumference of the chamber along at least a portion of the length of the chamber for confining the plasma to an area isolated from the walls of the chamber;

means for generating a second magnetic field within the chamber for confining the plasma within the chamber to an area proximate the outlet from the chamber; and a radiofrequency power supply comprised of an impedance-matching network and generator having one terminal connected to the chamber and the other terminal connected to ground.

15. A hollow-cathode plasma device comprising:

an evacuated chamber composed of an electrically conductive material and having one or more walls, and further having an outlet for a plasma formed within the chamber;

a gas inlet into the chamber;

magnetic means for confining a plasma to an area isolated from the walls of the chamber; and a radiofrequency power supply electrically connected to the chamber.

* * * * *